United States Patent
Bonecutter et al.

(10) Patent No.: US 11,326,256 B2
(45) Date of Patent: May 10, 2022

(54) DOME STRESS ISOLATING LAYER

(71) Applicant: Applied Materials, Inc., Santa Clara, CA (US)

(72) Inventors: Luke Bonecutter, Cedar Park, TX (US); Yunzhe Yang, Santa Clara, CA (US); Rupankar Choudhury, Karnataka (IN); Abhijit Kangude, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 238 days.

(21) Appl. No.: 16/691,259

(22) Filed: Nov. 21, 2019

(65) Prior Publication Data

US 2020/0181772 A1    Jun. 11, 2020

(30) Foreign Application Priority Data

Dec. 10, 2018  (IN) .............................. 2018/41046560

(51) Int. Cl.
  *C23C 16/455*   (2006.01)
  *C23C 16/458*   (2006.01)
  *C23C 16/44*    (2006.01)
(52) U.S. Cl.
  CPC ...... *C23C 16/4558* (2013.01); *C23C 16/4411* (2013.01); *C23C 16/458* (2013.01)
(58) Field of Classification Search
  CPC ............. C23C 16/4411; C23C 16/4558; C23C 16/458; C23C 16/4409; F16L 59/028; F16L 59/029; F16L 59/04

(Continued)

(56) References Cited

U.S. PATENT DOCUMENTS 5,643,394 A * 7/1997 Maydan ............ C23C 16/45574
                                                118/723 E
5,746,875 A * 5/1998 Maydan ............ C23C 16/45574
                                                118/723 E (Continued)

FOREIGN PATENT DOCUMENTS

| JP | 2008177524 A | 7/2008 |
|----|--------------|--------|
| JP | 2009283975 A | 12/2009 |
| KR | 20170066080 A | 6/2017 |

OTHER PUBLICATIONS

Chinese Office Action dated Jul. 10, 2020 for Application No. 201922220608.6.

(Continued)

*Primary Examiner* — Jeffrie R Lund
(74) *Attorney, Agent, or Firm* — Patterson + Sheridan, LLP

(57) ABSTRACT

Embodiments described herein relate to apparatus and techniques for mechanical isolation and thermal insulation in a process chamber. In one embodiment, an insulating layer is disposed between a dome assembly and a gas ring. The insulating layer is configured to maintain a temperature of the dome assembly and prevent thermal energy transfer from the dome assembly to the gas ring. The insulating layer provides mechanical isolation of the dome assembly from the gas ring. The insulating layer also provides thermal insulation between the dome assembly and the gas ring. The insulating layer may be fabricated from a polyimide containing material, which substantially reduces an occurrence of deformation of the insulating layer.

20 Claims, 2 Drawing Sheets

(58) Field of Classification Search
USPC .................................................. 118/715, 724
See application file for complete search history.

(56) References Cited

U.S. PATENT DOCUMENTS

| | | | |
|---|---|---|---|
| 6,623,596 | B1 | 9/2003 | Collins et al. |
| 7,413,627 | B2* | 8/2008 | Li .......................... C23C 16/401 |
| | | | 156/345.33 |
| 7,762,809 | B2 | 7/2010 | Takahashi et al. |
| 8,191,505 | B2 | 6/2012 | Kamaishi et al. |
| 2006/0060141 | A1 | 3/2006 | Kamaishi et al. |
| 2008/0090195 | A1 | 4/2008 | Takahashi et al. |
| 2008/0110400 | A1* | 5/2008 | Satou .................. H01J 37/3244 |
| | | | 118/723 VE |
| 2009/0145360 | A1 | 6/2009 | Zhao et al. |
| 2009/0260762 | A1 | 10/2009 | Kamaishi et al. |
| 2013/0288485 | A1* | 10/2013 | Liang .................... H01J 37/321 |
| | | | 438/782 |
| 2014/0165912 | A1* | 6/2014 | Kao .................. H01J 37/32357 |
| | | | 118/723 R |
| 2016/0148788 | A1* | 5/2016 | Tsai .................. H01J 37/32477 |
| | | | 277/652 |
| 2017/0162401 | A1 | 6/2017 | Kang et al. |
| 2017/0256383 | A1* | 9/2017 | Liao .................. H01J 37/32467 |
| 2017/0314124 | A1* | 11/2017 | Hwang .................. C23C 16/405 |
| 2018/0239242 | A1* | 8/2018 | Kohmura .................. G03F 1/64 |
| 2019/0328042 | A1* | 10/2019 | Krietzman ............. A24B 15/16 |
| 2020/0181772 | A1* | 6/2020 | Bonecutter ........... C23C 16/458 |

OTHER PUBLICATIONS

International Search Report and Written Opinion dated Mar. 9, 2020 for Application No. PCT/US2019/062647.

* cited by examiner

DOME STRESS ISOLATING LAYER

CROSS-REFERENCE TO RELATED APPLICATIONS

This application claims benefit of Indian provisional patent application serial number 2018/41046560, filed Dec. 10, 2018, which is herein incorporated by reference in its entirety.

BACKGROUND

Field

Embodiments of the present disclosure generally relate to semiconductor processing, and more specifically to apparatus and techniques for reducing heat transfer and mechanical stresses of a process chamber.

Description of the Related Art

Various processes are used to deposit films on a substrate. Film deposition is generally accomplished by introducing process gasses into a process chamber that contains the substrate. The process gasses are activated, for example, by heat, within the process chamber. When the process gasses are activated, components of the process chamber are heated by thermal conduction and thermal convection. Certain components of the process chamber are actively cooled by a cooling fluid. Components that are not actively cooled but are adjacent to an actively cooled part may also be cooled.

Polytetrafluoroethylene (PTFE) spacers are used to create physical separation between adjacent components of the process chamber to reduce heat transfer therebetween. However, as PTFE spacers are subjected to repeated heating and cooling, the PTFE spacers deform and are no longer suitable for use. Thus, conventional spacers fail to prevent or reduce heat transfer between chamber components over time, resulting in increased maintenance costs.

Accordingly, an improved process chamber design is needed.

SUMMARY

In one embodiment, an apparatus is provided which includes one or more chamber walls and a dome assembly. The one or more chamber walls and the dome assembly define a process volume therein. A support pedestal is disposed in the process volume. An annular gas ring is disposed between the one or more chamber walls and the dome assembly. An insulating layer is disposed on a surface of the annular gas ring adjacent to the dome assembly. The insulating layer is disposed between the annular gas ring and the dome assembly.

In another embodiment, an apparatus is provided which includes chamber walls and a dome assembly. The chamber walls and the dome assembly define a process volume therein. A support pedestal is disposed in the process volume. An annular gas ring is disposed between the chamber walls and the dome assembly. A polyimide layer is disposed between the annular gas ring and the dome assembly.

In another embodiment, an apparatus is provided which includes chamber walls and a dome assembly. The chamber walls and the dome assembly define a process volume therein. A support pedestal is disposed in the process volume. An annular gas ring is disposed between the chamber walls and the dome assembly. A polyimide layer is disposed between the annular gas ring and the dome assembly. The polyimide layer is disposed on a surface of the dome assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and techniques for mechanical isolation and thermal insulation in a process chamber. An insulating layer is disposed between a dome assembly and a gas ring. The insulating layer provides thermal insulation between the dome assembly and the gas ring. That is, the insulating layer is configured to reduce thermal energy transfer from the dome assembly to the gas ring. The insulating layer also provides mechanical isolation of the dome assembly from the gas ring. The insulating layer is fabricated from a polyimide containing material which substantially reduces an occurrence of deformation of the insulating layer.

Figure 1:
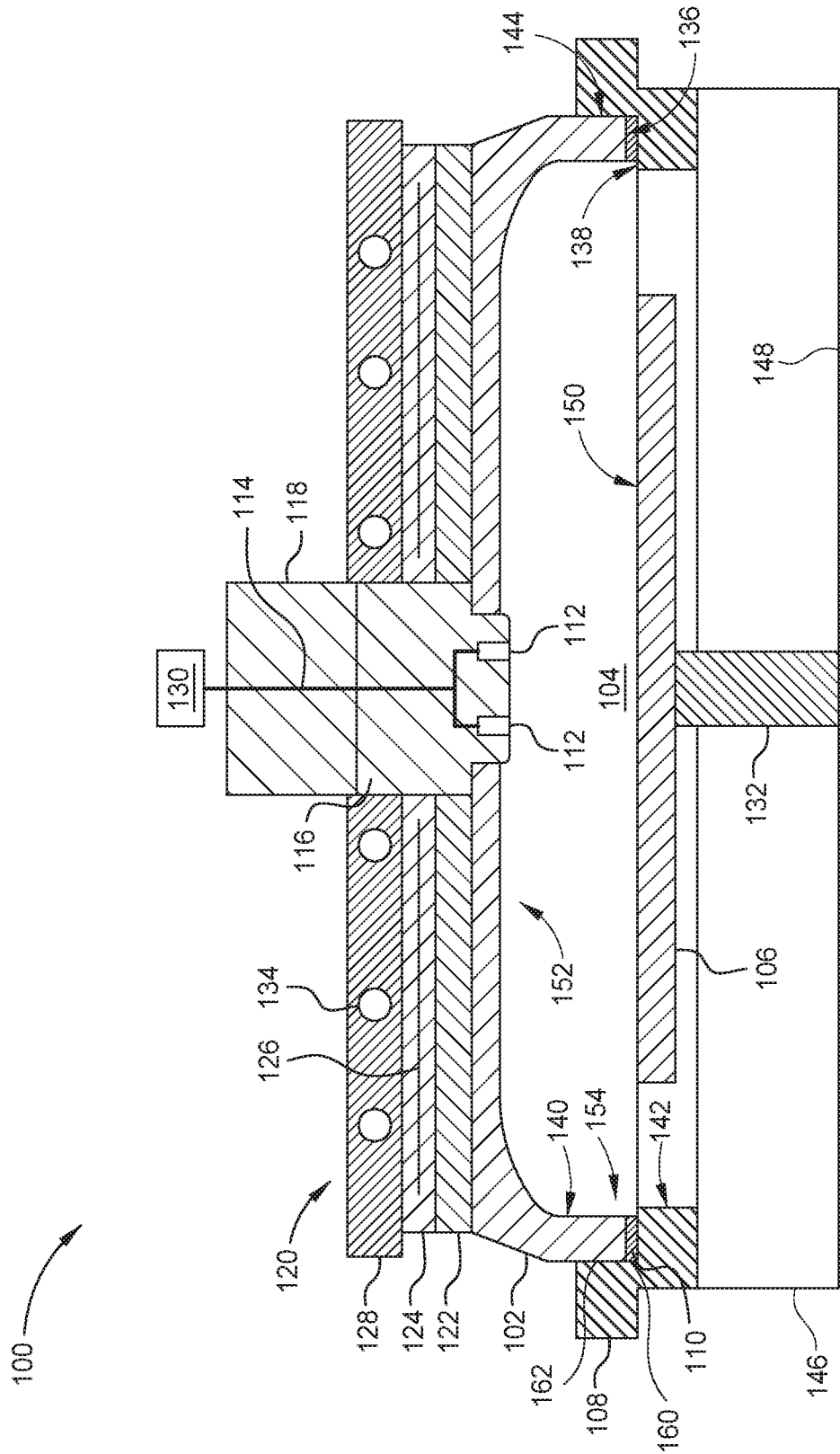
FIG. 1 is a schematic cross-sectional view of a process chamber according to one embodiment.

FIG. 1 is a schematic cross-sectional view of a process chamber 100 according to one embodiment. The process chamber 100 is fabricated from a process resistant material, such as aluminum, stainless steel, alloys thereof, or combinations thereof. The process chamber 100 includes a bottom 148, one or more chamber walls 146 extending laterally from and perpendicular to the bottom 148, a gas ring 108 coupled to the one or more chamber walls 146 opposite the bottom 148, and a dome assembly 120. A process volume 104 is defined in the process chamber 100 by at least the bottom 148, the one or more chamber walls 146, and an interior surface 140 of the dome assembly 120. A support pedestal 106 is disposed in the process volume 104. The support pedestal 106 is coaxial with a major axis of the process chamber 100. A support surface 150 of the support pedestal 106 supports a substrate (not shown) during processing.

A stem 132 extends from the support pedestal 106 opposite the dome assembly 120. The stem 132 is substantially parallel to the one or more chamber walls 146. In one embodiment, the support pedestal 106 is fabricated from a ceramic material. In another embodiment, the support pedestal 106 is fabricated from a graphite material coated with a silicon containing material, such as a silicon carbide material.

The dome assembly 120 includes a cooling plate 128, a heating plate 124, an insulator 122, and a dome 102. The heating plate 124 is disposed adjacent to the cooling plate 128. The insulator 122 is disposed adjacent to the heating plate 124 opposite the cooling plate 128. In one example, the heating plate 124 is disposed between the cooling plate 128 and the insulator 122. The heating plate 124 may be disposed in contact with both of the cooling plate 128 and the insulator 122. The dome 102 is adjacent to the insulator 122 opposite the heating plate 124. In one embodiment, the insulator 122 is disposed between the heating plate 124 and the dome 102. The insulator 122 may be disposed in contact with both of the heating plate 124 and the dome 102. One or more cooling channels 134 are formed in the cooling plate 128. A heating element 126, such as a resistive heater or the like, is disposed in the heating plate 124. In one embodiment, which may be combined with one or more embodiments described above, the dome 102 is fabricated from a ceramic material. For example, the dome 102 may be fabricated from an aluminum oxide containing material.

An injector body 116 is disposed through the dome assembly 120 and partially extends into the process volume 104 opposite the support pedestal 106. A cooling ring 118 is disposed adjacent to the injector body 116 opposite the process volume 104. The cooling ring 118 is coaxial with the injector body 116. One or more nozzles 112 are formed in the injector body 116 and are in fluid communication with the process volume 104. A conduit 114 is formed through the cooling ring 118 and the injector body 116. The conduit 114 is coupled to the nozzles 112.

A fluid source 130 is coupled to the conduit 114 opposite the nozzles 112. The fluid source 130 is in fluid communication with the process volume 104 via the nozzles 112. During processing, the fluid source 130 provides a process fluid to the process volume 104.

The gas ring 108 is disposed between the chamber walls 146 and the dome assembly 120. The gas ring 108 is disposed adjacent to the dome 102 opposite the insulator 122. The gas ring 108 is annular, and at least a portion of the gas ring 108 surrounds the support pedestal 106. A portion of the gas ring 108 extends radially outward of the dome 102. Another portion of the gas ring 108 is disposed below the dome 102. An inner surface 142 of the gas ring 108 extends radially inward of the interior surface 140 of the dome assembly 120.

In one embodiment, which may be combined with one or more embodiments described above, the gas ring 108 is fabricated from a metallic material, for example, an aluminum containing material. In one embodiment, which may be combined with one or more embodiments described above, the gas ring 108 is cooled by a cooling fluid used to transfer heat from the gas ring 108. For example, the cooling fluid may flow through one or more cooling channels (not shown) formed in the gas ring 108.

As described above, the dome 102 and the gas ring 108 are fabricated from different materials. Thus, a coefficient of thermal expansion of the dome 102 is lower than a coefficient of thermal expansion of the gas ring 108. The difference in coefficient of thermal expansion induces mechanical stress in the dome 102.

To control a temperature in the process volume 104, a temperature of the dome 102 is maintained to be substantially constant. To substantially reduce heat transfer from the dome 102 to the gas ring 108, an insulating layer 110 is disposed between the dome 102 and the gas ring 108. The insulating layer 110 is disposed between a surface 136 of the dome 102 and a surface 138 of the gas ring 108. The surface 138 of the gas ring 108 is coplanar with the support surface 150 the support pedestal 106. In one embodiment, which can be combined with one or more of the embodiments described above, the insulating layer 110 is fabricated from a polyimide containing material. The insulating layer 110 has a thermal conductivity of between about 0.08 W/(m·K) and about 0.3 W/(m·K), for example, about 0.17 W/(m·K). The insulating layer 110 has a thermal contact resistance of between about 2 cm$^2$ K/W and about 4 cm$^2$ K/W, for example, about 3.21 cm$^2$ K/W. The insulating layer 110 provides mechanical separation of the gas ring 108 from the dome 102. The insulating layer 110 also provides thermal isolation of the dome 102 from the gas ring 108. Additionally, the insulating layer 110 provides a physical barrier to prevent particles of the gas ring 108 from contacting or embedding into the dome 102. The high resistance to abrasion and friction of the polyimide containing material enables the insulating layer 110 to provide mechanical separation of the gas ring 108 from the dome 102 with fewer interruptions for repairs or replacement. An operating temperature of the insulating layer 110 is about 300° Celsius to about 400° Celsius, for example, about 350° Celsius.

As shown in FIG. 1, the insulating layer 110 is disposed between the surface 136 of the dome 102 and the surface 138 of the gas ring 108 such that the surfaces 136, 138 are spaced apart by a distance that is equal to the thickness of the insulating layer 110. As also shown in FIG. 1, the gas ring 108 is also in contact with a surface 160 of the insulating layer 110 that is both opposite the process volume 104 and perpendicular to surfaces 136, 138. Furthermore, the surface 162 of the gas ring 108 that is in contact with the insulating layer 110 surface 160 that is perpendicular to surfaces 136, 138 is also in contact with the dome 102, more specifically, in contact with a surface 144 of the dome 102 that is both opposite the process volume 104 and perpendicular to surfaces 136, 138.

In one embodiment, which can be combined with one or more of the embodiments described above, the insulating layer 110 is deposited on the gas ring 108 using a deposition process, such as chemical vapor deposition or physical vapor deposition, at a temperature of about 50° Celsius to about 60° Celsius. Before the insulating layer 110 is deposited, the surface 138 of the gas ring 108 may be roughened to increase adherence of the insulating layer 110 thereto. The deposited insulating layer 110 is cured at a temperature of between about 350° Celsius and about 400° Celsius. A thickness of the deposited insulating layer 110 is about 0.0025 inches to about 0.0035 inches. Alternatively, the insulating layer 110 is a thin film sheet that is positioned between the gas ring 108 and the dome 102. A thickness of the thin film sheet is about 0.010 inches to about 0.020 inches.

Figure 2:
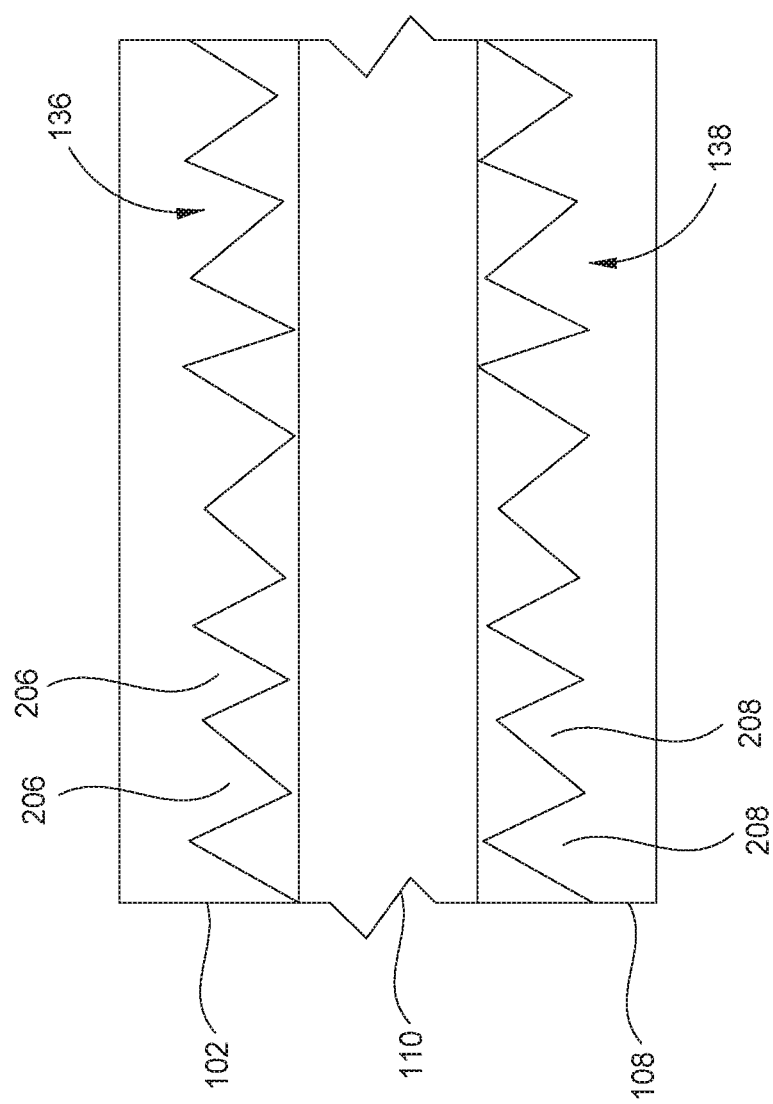
FIG. 2 is a schematic representation of magnified surfaces according to one embodiment.

FIG. 2 is a schematic representation of magnified surfaces according to one embodiment, which may be combined with one or more of the embodiments described above. As described with respect to FIG. 1, the insulating layer 110 is positioned between the surface 136 of the dome 102 and the surface 138 of the gas ring 108. The surface 136 of the dome 102 and the surface 138 of the gas ring 108 have an RMS surface roughness of between about 10 microns and about 100 microns, for example, between about 25 microns and about 75 microns, due to one or more imperfections 206 and 208. The imperfections 206, 208 include one or more of a protrusion and an indentation.

As a temperature of the dome 102 increases during processing, mechanical stresses from the imperfections 206 touching a surface of the insulating layer 110 are increased. Over time, the mechanical stresses cause cracks to develop in the dome 102 which negatively affect the process in the process volume 104 or result in failure and collapse of the dome 102. The imperfections 206, 208 embed into the insulating layer 110. Thus, the insulating layer 110 reduces stress in the dome 102 and the gas ring 108. In one embodiment, the insulating layer 110 reduces a pressure at a given point of contact between the dome 102 and the gas ring 108 by more than about 150%, for example, between about 160% and about 300%, such as between about 180% and about 200%.

Advantageously, the insulating layer 110 provides thermal insulation and mechanical isolation between the dome 102 and the gas ring 108. The insulating layer 110 substantially reduces a temperature difference between an upper portion 152 of the dome 102 adjacent to the insulator 122 and a lower portion 154 of the dome 102 adjacent to the gas insulating layer 110. For example, the insulating layer 110 reduces a temperature difference between the upper portion 152 of the dome 102 and lower portion 154 of the dome 102 by between about 15% and about 30%, for example about 20%.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
   one or more chamber walls and a dome assembly defining a process volume therein, the dome assembly comprising a dome having an outermost surface defining a circumference of the dome;
   a support pedestal disposed in the process volume;
   an annular gas ring disposed between the one or more chamber walls and the dome assembly, the annular gas ring having an inner surface in contact with and radially outward of the outermost surface of the dome; and
   an insulating layer disposed on a surface of the annular gas ring adjacent to the dome assembly, the insulating layer disposed between the annular gas ring and the dome assembly.

2. The apparatus of claim 1, wherein the insulating layer comprises polyimide.

3. The apparatus of claim 1, wherein the dome assembly comprises:
   a cooling plate having cooling channels formed therein;
   a heating plate having a heating element disposed therein, the heating plate disposed adjacent to the cooling plate;
   an insulator disposed adjacent to the heating plate opposite the cooling plate; and
   a dome disposed adjacent to the insulator and opposite the heating plate.

4. The apparatus of claim 3, wherein a thickness of the insulating layer is between about 0.0025 inches and about 0.0035 inches.

5. The apparatus of claim 3, wherein a thickness of the insulating layer is between about 0.010 inches and about 0.020 inches.

6. The apparatus of claim 3, wherein a surface of the annular gas ring is roughened to increase adherence of the insulating layer thereto.

7. The apparatus of claim 3, wherein imperfections on the surface of the annular gas ring and imperfections on a surface of the dome are embedded into the insulating layer.

8. An apparatus, comprising:
   chamber walls and a dome assembly defining a process volume therein, the dome assembly comprising a dome having an outermost surface defining a circumference of the dome;
   a support pedestal disposed in the process volume;
   an annular gas ring disposed between the chamber walls and the dome assembly, the annular gas ring having an inner surface in contact with and radially outward of the outermost surface of the dome; and
   a polyimide layer disposed between the annular gas ring and the dome assembly.

9. The apparatus of claim 8, wherein a surface of the annular gas ring is roughened to increase adherence of the polyimide layer thereto.

10. The apparatus of claim 9, wherein the surface of the annular gas ring has an RMS surface roughness of between about 10 microns and about 100 microns.

11. The apparatus of claim 8, wherein a thickness of the polyimide layer is between about 0.0025 inches and about 0.0035 inches.

12. The apparatus of claim 8, wherein a thickness of the polyimide layer is between about 0.010 inches and about 0.020 inches.

13. The apparatus of claim 8, wherein the dome assembly comprises:
    a cooling plate having cooling channels formed therein;
    a heating plate having a heating element disposed therein, the heating plate disposed adjacent to the cooling plate;
    an insulator disposed adjacent to the heating plate opposite the cooling plate; and
    a dome disposed adjacent to the insulator and opposite the heating plate.

14. The apparatus of claim 13, wherein imperfections on a surface of the annular gas ring and on a surface of the dome are embedded into the polyimide layer.

15. The apparatus of claim 13, further comprising:
    an injector in fluid communication with the process volume, the injector disposed opposite the support pedestal; and
    a stem extending from the support pedestal opposite the dome assembly.

16. The apparatus of claim 13, wherein the dome comprises a ceramic material.

17. The apparatus of claim 16, wherein the ceramic material comprises aluminum oxide.

18. An apparatus, comprising:
    a dome assembly comprising a dome having an outermost surface defining a circumference of the dome;
    an annular gas ring, the annular gas ring having an inner surface in contact with and radially outward of the outermost surface of the dome; and
    a polyimide layer with a thickness of about 0.0025 inches to about 0.0035 inches deposited on a surface of the annular gas ring.

19. The apparatus of claim 18, wherein the polyimide layer has a thermal conductivity between about 0.08 W/(m·K) and about 0.3 W/(m·K).

20. The apparatus of claim 18, wherein the polyimide layer has a thermal contact resistance of between about 2 $cm^2$ K/W and about 4 $cm^2$ K/W.

* * * * *